(12) United States Patent
Min et al.

(10) Patent No.: US 7,379,322 B2
(45) Date of Patent: May 27, 2008

(54) AMORPHOUS HIGH-K THIN FILM AND MANUFACTURING METHOD THEREOF

(75) Inventors: Yo-sep Min, Yongin-si (KR); Young-jin Cho, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 22 days.

(21) Appl. No.: 11/354,013

(22) Filed: Feb. 15, 2006

(65) Prior Publication Data

US 2006/0180838 A1 Aug. 17, 2006

(30) Foreign Application Priority Data

Feb. 15, 2005 (KR) ............... 10-2005-0012442

(51) Int. Cl.
*G11C 11/22* (2006.01)
(52) U.S. Cl. ............... 365/145; 438/3; 257/295; 257/310
(58) Field of Classification Search ............... 365/145
See application file for complete search history.

(56) References Cited

U.S. PATENT DOCUMENTS

2006/0131672 A1* 6/2006 Wang et al. ............... 257/410

OTHER PUBLICATIONS

A. Donnermeyer, "Complementary gratings due to electron and hole conductivity in aluminum-doped bismuth titanium oxide crystals", Dec. 2003, www.physica-status-solidi.com, 3rd paragraph of the introduction.*

G.D. Wilk et al., Journal of Applied Physics vol. 87, No. 1, Hafnium and ziconium silicates for advanced gate dielectrics pp. 484-492 Jan. 1, 2000.

M.H. Cho et al., Applied Physics Letters vol. 81, No. 6, Dielectric Characteristics of $Al_2O_3$-$HfO_2$ nanolaminates on Si(100) pp. 1071-1073 Aug. 5, 2002.

Hyo Sik Chang et al., Applied Physics Letter vol. 80, No. 18, Excellent thermal stability of $Al_2O_3$/ZrO/$Al_2O_3$ stack structure for metal-oxide-semiconductor gate dielectrics application pp. 3385-3387, May 6, 2002.

* cited by examiner

*Primary Examiner*—Sue A. Purvis
*Assistant Examiner*—Eduardo A. Rodela
(74) *Attorney, Agent, or Firm*—Buchanan Ingersoll & Rooney PC

(57) ABSTRACT

An amorphous high-k thin film for a semiconductor device and a manufacturing method thereof are provided. The amorphous high-k thin film includes Bi, Ti, Al, and O. Since a BTAO based amorphous dielectric thin film is used as a dielectric material of a DRAM capacitor, a dielectric constant is more than 25, and an increase of a leakage current caused in reducing a physical thickness of the dielectric thin film can be prevented. Accordingly, it is very useful for the integration of the semiconductor device.

9 Claims, 4 Drawing Sheets

AMORPHOUS HIGH-K THIN FILM AND MANUFACTURING METHOD THEREOF

CROSS-REFERENCE TO RELATED PATENT APPLICATION

This application claims the benefit of Korean Patent Application No. 10-2005-0012442, filed on Feb. 15, 2005, in the Korean Intellectual Property Office, the disclosure of which is incorporated herein in its entirety by reference.

BACKGROUND OF THE DISCLOSURE

1. Field of the Disclosure

The present disclosure relates to an amorphous high-k thin film for a capacitor of a highly integrated memory device and a manufacturing method thereof, and more particularly, to an amorphous high-k thin film using Bi—Ti—Al—O (BTAO) based materials with an amorphous microstructure as a capacitor of a memory device, and a manufacturing method thereof.

2. Description of the Related Art

According to Moore's law, the integration of a dynamic random access memory (DRAM) increases about 4 times every 3 years and the design rule continuously decreases. Accordingly, a plane space occupied by a unit cell continuously decreases. In the case of a DRAM cell consisting of one transistor and one capacitor, a plane space for a capacitor inevitably decreases and thus a plane size of the capacitor decreases. Therefore, a capacitance (C) of the capacitor decreases as given by $$C = \varepsilon \frac{A}{t}$$

where, $\varepsilon$ is a dielectric constant,

A is an effective area, and t is a thickness of a dielectric thin film.

Even though the feature size of a device continuously reduces, a capacitance (>25 fF/cell) for the operation of the DRAM must be maintained. Therefore, many attempts have been made to reduce a thickness of a dielectric thin film and increase the area. Recently, many studies for replacing a traditional dielectric thin film (i.e., $SiO_2$) with a high-k oxide film have been made.

In the semiconductor industries, a high-k thin film is used in a gate oxide film and a dielectric film of a DRAM capacitor. The recent research for the gate oxide film focus on Hf— or Zr-based oxide films and oxide films formed of group-III metals such as lanthanide. The high-k gate oxide film has a large leakage current because of its narrow band gap, and the thermal stability deteriorates at a high temperature when the gate oxide film contacts with a silicon surface. Recently, many research efforts have been directed to attempting to solve these problems of the dielectric thin film by adding $SiO_2$ or $Al_2O_3$, which has good thermal stability and a large band gap (refer to Journal of Applied Physics, 87, 484 (2000); Appl. Phys. Lett. 80, 3385 (2002); Appl. Phys. Lett.81, 1071 (2002)).

However, the thin film formed by mixing the high-k material and $SiO_2$ or $Al_2O_3$ has an amorphous microstructure and its dielectric constant becomes remarkably small. For this reason, the use of the amorphous mixed phase as the dielectric material of the capacitor has not attracted attention. For example, in the crystalline thin film with the Perovskite structure, when $(Ba,Sr)TiO_3$ thin film (BST) having a dielectric constant of 250 or more becomes amorphous, its dielectric constant is reduced to about 25.

The capacitor dielectric of a Gbit DRAM must have a physical thickness of below about 15 nm and a thickness of an oxide equivalent film must be below about 1 nm. Therefore, it is impossible to use the amorphous dielectric thin film. Accordingly, crystalline high-k thin films have been investigated. However, if the crystalline high-k thin film becomes thin up to about 15 nm, a leakage current increases through the grain boundary.

Meanwhile, when high-k material formed of multi components such as BST is applied to a capacitor, it is very difficult to deposit a thin film having a uniform composition in three-dimensional patterns in the capacitor with the three-dimensional structure. Since the charge-to-radius ratio of group-II metals, such as Ba or Sr is small, the precursor structure is unstable and vapor pressure is insufficient.

SUMMARY OF THE DISCLOSURE

The present invention provides an amorphous high-k thin film, in which no leakage current occurs when the amorphous high-k thin film is applied to a semiconductor device such as DRAM, and uniform thickness and uniform composition can be obtained when manufacturing a three-dimensional capacitor.

According to an aspect of the present invention, there is provided an amorphous high-k thin film for a memory device including Bi, Ti, Al, and O.

The amorphous high-k film may be formed of $Bi_{1-x-y}Ti_yAl_yO_z$ (0.2<x<0.5, 0<y<0.5, 1.5<Z<3).

According to another aspect of the present invention, there is provided a method of manufacturing an amorphous high-k thin film for a semiconductor device including a bottom structure, a dielectric thin film, and a top electrode, the method including forming the amorphous high-k film including Bi, Ti, Al, and O on the bottom structure.

The amorphous high-k thin film may be formed by an atomic layer deposition.

When forming of the amorphous high-k thin film, single layers of Bi, Ti and Al may be formed as precursors on the bottom structure and at least one of $O_3$ and $H_2O$ may be used as a reaction gas.

The forming of the amorphous high-k thin film may include: forming Bi and Ti thin films as Bi and Ti precursors on the bottom structure, and performing oxidation to form Bi and Ti oxide film; and forming an Al thin film as an Al precursor on the Bi and Ti oxide layers, and performing oxidation to form an Al oxide film.

BRIEF DESCRIPTION OF THE DRAWINGS

The above and other features and advantages of the present invention will be described in detailed exemplary embodiments thereof with reference to the attached drawings in which.

DETAILED DESCRIPTION OF PREFERRED EMBODIMENTS

An exemplary semiconductor device with an amorphous high-k thin film and an exemplary manufacturing method thereof according to embodiments of the present invention will now be described in detail with reference to the accompanying drawings.

Figure 1:
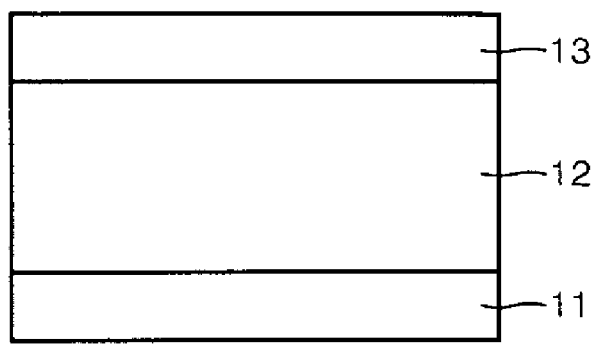
FIG. 1 is a sectional view of a capacitor structure with an amorphous high-k thin film according to an embodiment of the present invention.

FIG. 1 is a sectional view illustrating a DRAM capacitor structure with an amorphous high-k thin film according to an embodiment of the present invention. A dielectric thin film 12 is formed on a bottom structure 11 and a top electrode 13 is formed on the dielectric thin film 12. The dielectric thin film is formed of Bi (bismuth)-Ti (titanium)-Al (aluminum)-O (oxide) based material.

Although the relative proportions of each material are not limited, it is preferable that Bi and Ti be present in a similar fraction to each other. If the fraction of Al is below about 50%, the dielectric constant increases. Once crystallized, the dielectric constant increases, but a leakage current may occur. Accordingly, it is preferable that the composition of the dielectric thin film 12 is $Bi_{1-x-y}Ti_yAl_yO_z$ (0.2<x<0.5, 0<y<0.5, 1.5<Z<3).

Since the BTAO based material is not crystalline but dielectric, there is no increase in the leakage current through the crystal grain when the BTAO based material is formed in a thin film. Also, an additional thermal treatment for crystallization is not required because the BTAO based material has a high dielectric constant of about 25. Although the BTAO thin film that is an amorphous dielectric material according to the present invention is an oxide film comprised of multi components including three metal ions, its ion radius is small and its valance is more than 3. Therefore, the volatility of a precursor is good and stable and therefore a thin film process can be readily carried out.

An exemplary method of forming a BTAO thin film according to an embodiment of the present invention will now be described in greater detail. A Si substrate is used as a bottom structure 11 and a BTAO dielectric thin film 12 is formed on the bottom structure 11. The BTAO dielectric thin film 12 is formed to 12 nm thickness.

A method of forming the BTAO dielectric thin film 12 according to an embodiment of the present invention will now be described.

An atomic layer deposition (ALD), a low temperature process, is used to form the BTAO dielectric film 12. Although a chemical vapor deposition (CVD) is used to form a simple structure, it is preferable that an ALD is used to form a more complicated three-dimensional structure. A thin film is formed using Bi (mm=1-methoxy-2-methyl-2-propoxide)3, Ti (mmp) 4, and Al (TMA:trimethylaluminium) as precursors, and at least one of $O_3$ and $H_2O$ is used as a reaction gas. Using the precursors, Bi, Ti and Al are formed on the bottom structure 11 by the ALD. Like this, the BTAO thin film 12 can be formed in a simple process.

To study the property of a BTAO thin film depending on an Al composition, a BTO thin film is formed by repeating the operations of: adsorbing Bi and Ti precursors on the bottom structure 11; purging the remaining precursors in a chamber; and performing oxidation (operation 1). Next, the operations of injecting the Al precursor into the chamber to adsorb the Al precursor, purging the remaining Al precursor, and performing oxidation are repeated (operation 2). By repeating the entire operations, the BTAO thin film 12 is formed.

Figure 2A:
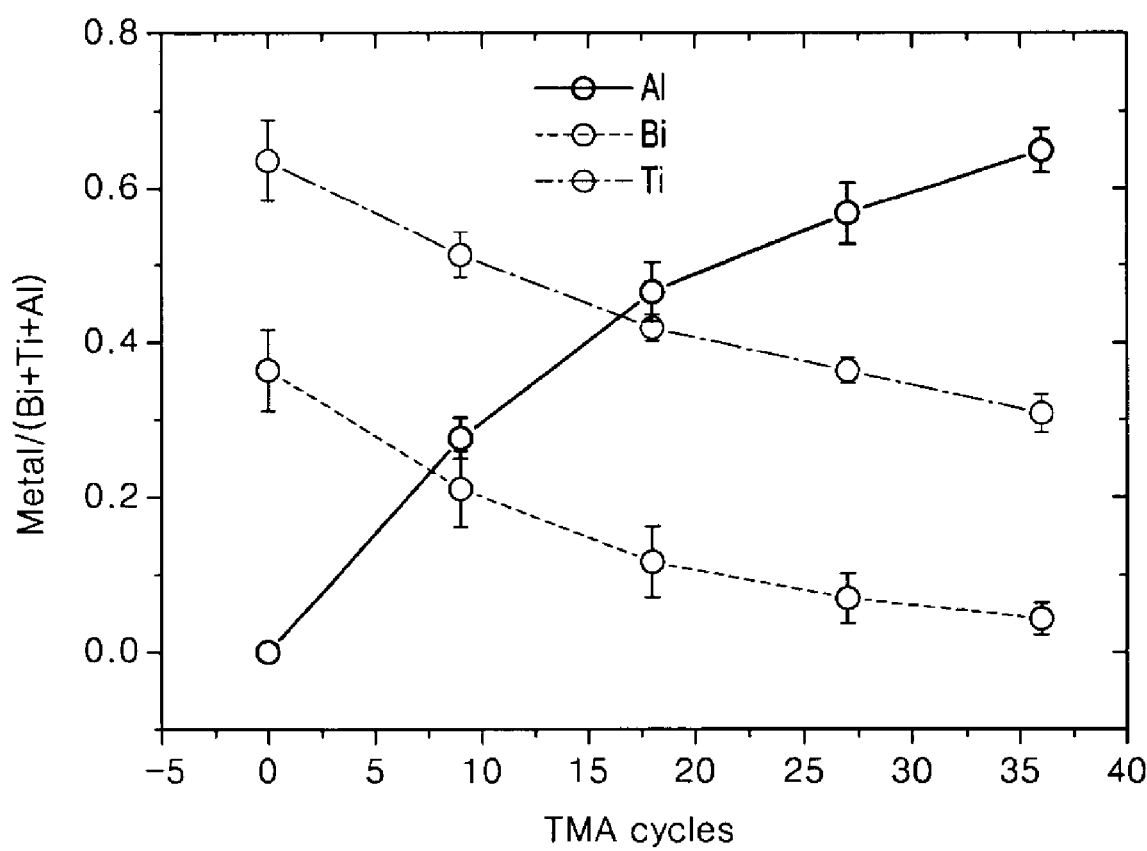
FIG. 2A is a graph illustrating a result of a composition analysis using an inductively coupled plasma-atomic emission spectroscopy (ICP-AES) after a BTAO thin film of 12 nm thick is formed on a substrate according to an embodiment of the present invention.

FIG. 2A is a graph illustrating an ICP analysis of compositions of Bi, Ti and Al according to the number of repetitions of the operation 2 after the BTO thin film is formed in the operation 1. Referring to FIG. 2A, the Al composition ratio continuously increases according to the number of repetitions of operation 2.

Figure 2B:
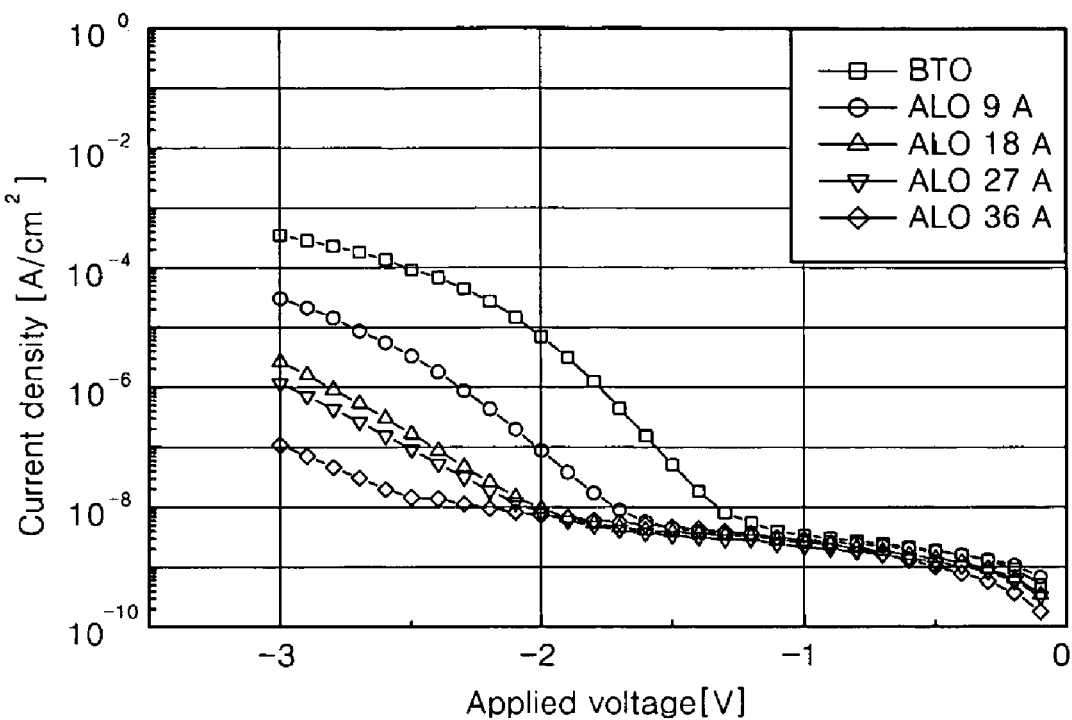
FIG. 2B is a graph illustrating a leakage current property depending on a change of an Al composition.

FIG. 2B is a graph illustrating a leakage current property depending on a thickness of an $Al_2O_3$ thin film with respect to the BTO thin film formed by the operation 1. Each thickness of the $Al_2O_3$ thin film formed on the BTO thin film is 9 Å, 18 Å, 27 Å, and 36 Å. This means that Al composition ratio gradually increases in the entire BTAO thin film. Pt is coated on the BTAO thin film as a top electrode.

Referring to 2B, as Al composition ratio gradually increases in the BTAO thin film, the leakage current decreases. It should be noted that the BTAO thin film is in an amorphous state in which an additional thermal treatment for crystallization is not performed. Thus, a leakage current through a grain boundary during the crystallization is very small.

Figure 2C:
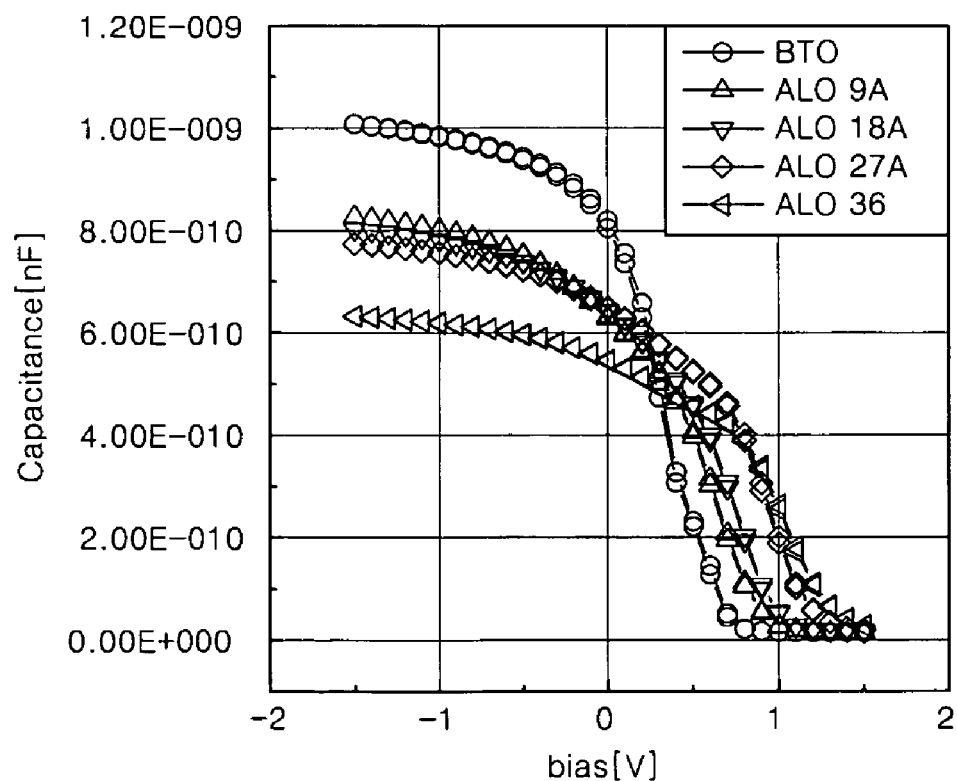
FIG. 2C is an electron energy loss spectroscopy (EELS) graph illustrating a change of electrostatic capacitance depending on a change of the Al composition.
Figure 2D:
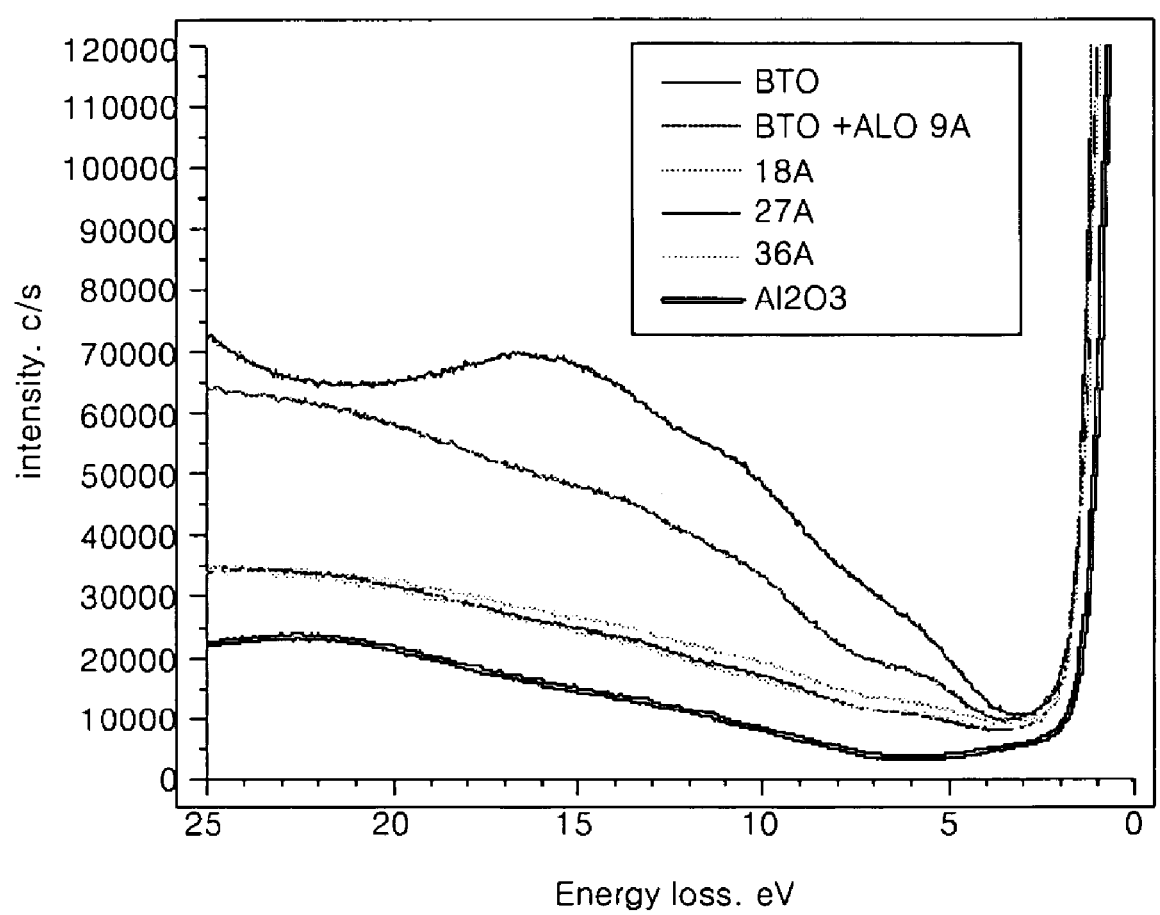
FIG. 2D is a graph illustrating a change of a band gap depending on a change of the Al composition.

FIG. 2C is a graph illustrating an electrostatic capacitance depending on a change in a thickness of $Al_2O_3$ thin film with respect to the BTO thin film formed by the operation 1. A specimen in FIG. 2C is equal to that in FIG. 2B. Referring to FIG. 2C, as the Al composition gradually increases, an electrostatic capacitance decreases. In FIG. 2D, an energy band gap is examined with respect to the same specimen. It can be seen that as the Al composition increases, the energy band gap increases. Consequently, as the Al composition ratio increases, the dielectric constant decreases. However, the energy band gap increases, thereby improving the leakage current characteristic. Although the dielectric constant decreases, a thin film can be selected having a high dielectric constant.

Figure 3A:
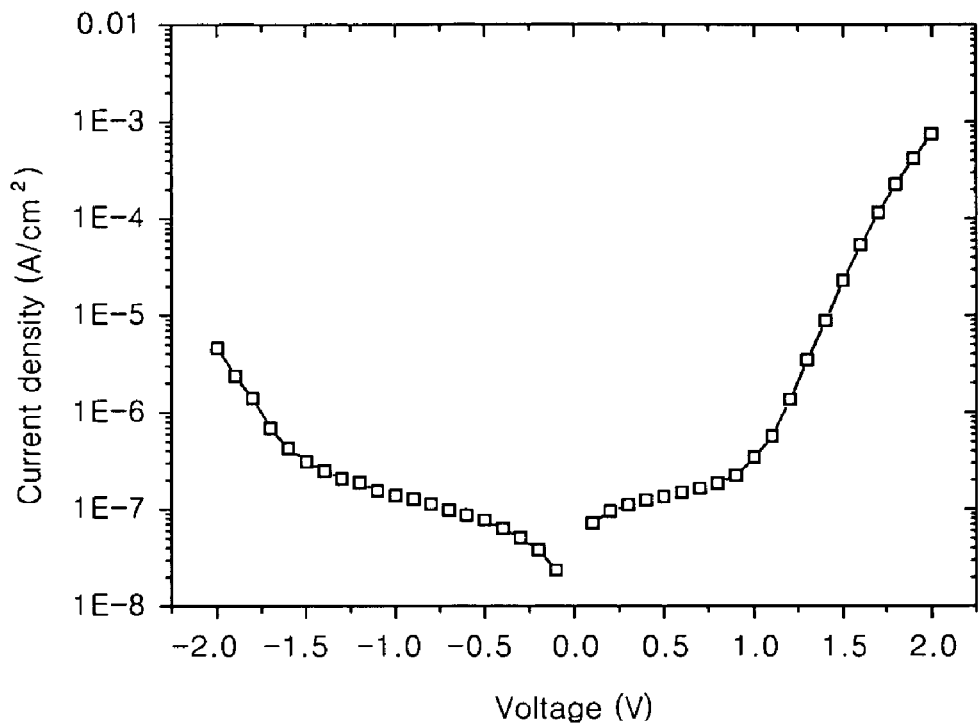
FIG. 3A is a graph illustrating a leakage current property of a BTAO dielectric thin film according to an embodiment of the present invention.
Figure 3B:
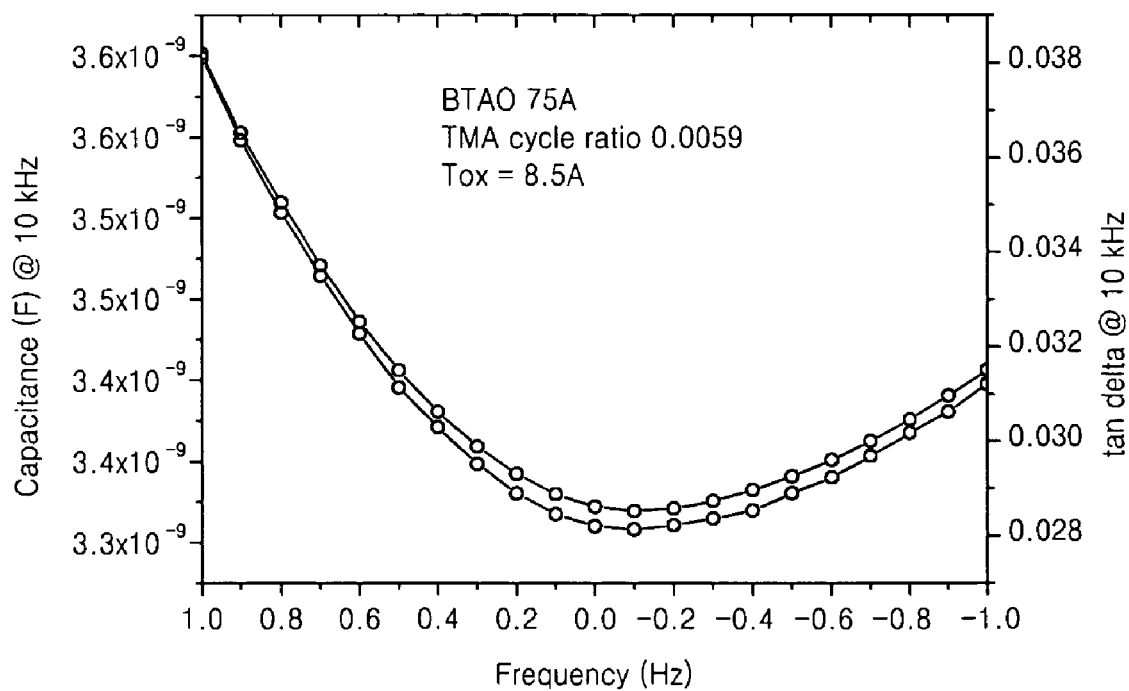
FIG. 3B is a graph illustrating a dielectric constant property of a BTAO dielectric thin film according to an embodiment of the present invention.

FIGS. 3A and 3B are graphs illustrating the electrical property of the BTSO film formed according to an embodiment of the present invention. A total thickness of the BTAO thin film can be below about 10 nm. In this embodiment, the BTAO thin film is formed to a 7.5 nm thickness. Referring to FIGS. 3A and 3B, the current density is about 10-7 V/cm² at 1 V, which is a requirement of the DRAM capacitor. Therefore, the BTAO thin film has a good leakage current property. Also, it can be confirmed that the BTAO thin film has an oxide equivalent thickness of 8.5 Å and has a stable dielectric constant.

The present invention has following effects.

First, since the BTAO amorphous dielectric thin film layer is used as the dielectric thin film of the DRAM capacitor, the increase of the leakage current caused when reducing the physical thickness of the dielectric thin film can be prevented.

Second, the dielectric thin film is an amorphous thin film but has a high dielectric constant. Thus, the capacitor can be manufactured without any additional thermal treatment for crystallization.

Third, the amorphous thin film consists of elements having a relatively large charge-to-radius ratio. Therefore, when manufacturing the capacitor with a three-dimensional structure, almost perfect thickness and uniformity can be obtained.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A high-k thin film for a memory device consisting of an amorphous film of Bi, Ti, Al, and O.

2. The amorphous high-k thin film of claim 1, wherein Bi and Ti are present in a similar fraction to each other.

3. The amorphous high-k thin film of claim 1, wherein the fraction of Al is below 50%.

4. The amorphous high-k thin film of claim 1, wherein the thin film has a dielectric constant of about 25.

5. An amorphous high-k thin film for a memory device, wherein the amorphous high-k film is formed of $Bi_{1-x-y}Ti_yAl_yO_z$ ($0.2<x<0.5$, $0<y<0.5$, $1.5<Z<3$).

6. A method of manufacturing an amorphous high-k thin film for a semiconductor device, the semiconductor device including a bottom structure, a dielectric thin film, and a top electrode, the method comprising:

forming the amorphous high-k film including Bi, Ti, Al, and O on the bottom structure, wherein the amorphous high-k thin film is formed of $Bi_{1-x-y}Ti_yAl_yO_z$ ($0.2<x<0.5$, $0<y<0.5$, $1.5<Z<3$).

7. The method of claim 6, wherein the amorphous high-k thin film is formed by an atomic layer deposition.

8. The method of claim 7, wherein when forming of the amorphous high-k thin film, single layers of Bi, Ti and Al are formed as precursors on the bottom structure and at least one of $O_3$ and $H_2O$ is used as a reaction gas.

9. The method of claim 7, wherein the forming of the amorphous high-k thin film comprises:

forming Bi and Ti thin films as Bi and Ti precursors on the bottom structure, and performing oxidation to form Bi and Ti oxide film; and forming an Al thin film as an Al precursor on the Bi and Ti oxide layers, and performing oxidation to form an Al oxide film.

* * * * *